United States Patent
Piret et al.

(10) Patent No.: US 7,392,461 B2
(45) Date of Patent: Jun. 24, 2008

(54) DECODING FOR ALGEBRAIC GEOMETRIC CODE ASSOCIATED WITH A FIBER PRODUCT

(75) Inventors: Philippe Piret, Cesson-Sevigne (FR); Frédéric Lehobey, Rennes (FR); Philippe Le Bars, Thorigne-Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 247 days.

(21) Appl. No.: 11/034,009

(22) Filed: Jan. 13, 2005

(65) Prior Publication Data

US 2005/0257115 A1 Nov. 17, 2005

(30) Foreign Application Priority Data

Jan. 13, 2004 (FR) .................... 04 00267

(51) Int. Cl.
*H03M 13/00* (2006.01)
(52) U.S. Cl. .................................... 714/785
(58) Field of Classification Search ............... 714/785
See application file for complete search history.

(56) References Cited

U.S. PATENT DOCUMENTS

| | | | | |
|---|---|---|---|---|
| 5,341,385 A | * | 8/1994 | Shirota ..................... 714/784 |
| 5,428,628 A | * | 6/1995 | Hassner et al. ............. 714/759 |
| 5,905,739 A | | 5/1999 | Piret et al. ............. 371/37.01 |
| 5,942,005 A | * | 8/1999 | Hassner et al. ............. 714/784 |
| 6,256,763 B1 | * | 7/2001 | Oh et al. .................. 714/784 |
| 6,438,112 B1 | | 8/2002 | Piret et al. ................. 370/298 |
| 6,543,021 B1 | | 4/2003 | Piret ........................ 714/752 |
| 6,578,170 B1 | | 6/2003 | Piret et al. ................. 714/758 |
| 6,578,171 B1 | | 6/2003 | Braneci et al. ............. 714/786 |
| 6,631,172 B1 | * | 10/2003 | Shokrollahi et al. ......... 375/340 |
| 6,634,007 B1 | * | 10/2003 | Koetter et al. .............. 714/784 |
| 6,638,318 B1 | | 10/2003 | Piret et al. ................. 718/781 |
| 6,766,489 B1 | | 7/2004 | Piret et al. ................. 714/755 |
| 6,792,569 B2 | * | 9/2004 | Cox et al. .................. 714/781 |
| 6,877,125 B2 | | 4/2005 | Le Bars et al. ............. 714/755 |

(Continued)

FOREIGN PATENT DOCUMENTS

WO WO2004047306 A1 6/2004

OTHER PUBLICATIONS

S. Stepanov et al., "Fibre Products of Superelliptic Curves and Codes Therefrom", Information Theory, Jun. 29, 1997, p. 413.

(Continued)

*Primary Examiner*—Jacques Louis-Jacques
*Assistant Examiner*—Sam Rizk
(74) *Attorney, Agent, or Firm*—Fitzpatrick, Cella, Harper & Scinto

(57) ABSTRACT

The present invention concerns a method and apparatus of decoding a one-point algebraic geometric code defined on an algebraic curve represented by an equation in X and Z of degree $2^{\mu\phi}$ in Z, where $\phi$ is a strictly positive integer and $\mu$ an integer greater than 1, obtained by taking the fiber product of $\mu$ component algebraic equations, each of said component equations governing the unknown X and an unknown $Y_i$, where i=0, . . . , $\mu$−1, and being of degree $2^{\phi}$ in $Y_i$. This method comprises the decoding of $2^{(\mu-1)\phi}$ "clustered" codes, all defined on the same algebraic curve represented by one of said component equations.

18 Claims, 2 Drawing Sheets

U.S. PATENT DOCUMENTS

| | | | |
|---|---|---|---|
| 6,898,251 B2 | 5/2005 | Le Bars et al. | 375/295 |
| 6,915,478 B2 * | 7/2005 | Cox | 714/784 |
| 7,039,853 B2 * | 5/2006 | Hsu et al. | 714/784 |
| 2002/0071496 A1 | 6/2002 | Ehrmann | 375/295 |
| 2002/0099997 A1 | 7/2002 | Piret | 714/781 |
| 2003/0177430 A1 | 9/2003 | Piret | 714/751 |
| 2004/0117719 A1 | 6/2004 | Lehobey et al. | 714/781 |
| 2004/0194006 A1 | 9/2004 | Piret et al. | 714/800 |
| 2005/0015704 A1 | 1/2005 | Piret et al. | 714/781 |
| 2005/0138533 A1 | 6/2005 | Le Bars et al. | 714/784 |
| 2005/0188291 A1 * | 8/2005 | Piret et al. | 714/752 |
| 2005/0204268 A1 * | 9/2005 | Piret et al. | 714/781 |
| 2005/0210357 A1 * | 9/2005 | Piret et al. | 714/752 |
| 2005/0257115 A1 * | 11/2005 | Piret et al. | 714/752 |

OTHER PUBLICATIONS

J.H. van Lint et al., "Algebraic Geometry Codes", Introduction to Coding Theory 3rd Edition, Chapter 10, Springer-Verlag, US, pp. 148-165, 1999.

D.A. Leonard, "A Generalized Forney Formula for Algebraic-Geometry Codes", IEEE Press, US, IEEE Transactions on Information Theory, vol. 42, No. 4, pp. 1263-1268, Jul. 1996.

H. Stichtenoth, "Algebraic Function Fields and Codes", Foundations of the Theory of Algebraic Functions Fields, Chapter 1, Springer-Verlag, US, pp. 1-29, 1993.

S. Miura, "Hyperelliptic Codes II", 12th Symposium on the Theory of Information and its Applications—SITA '89, Inuyama, Japan, Dec. 1989.

R.E. Blahut, "Theory and Practice of Error Control Codes", Addison Wesley, US, XP002272858, pp. 94-96, Chapter 5.1: "Viewing a Code from an Extension Field", 1984.

R.E. Blahut, "Theory and Practice of Error Control Codes", Addison Wesley, US, XP002272857 pp. 119-123, Chapter 5.8: "The Binary Golay Code", 1983.

Van Lint, "Algebraic Geometric Codes", in "Coding Theory and Design Theory", 1st Part, *The IMA Volumes in Mathematics and Its Applications*, vol. 20, Springer-Verlag, Berlin, 1990.

Høholdt et al., "*On the Decoding of Algebraic-Geometric Codes*", IEEE Transactions on Information Theory, vol. 41, No. 6, pp. 1589-1614, Nov. 1995.

Skorobogatov et al., "*On the Decoding of Algebraic-Geometric Codes*", IEEE Transactions on Information Theory, vol. 36, No. 5, pp. 1051-1060, Sep. 1990.

Sakata et al., "*Generalized Berlekamp-Massey Decoding of algebraic-Geometeric Codes up to Half the Feng-Rao Bound*", IEEE Transactions on Information Theory, vol. 41, No. 6, pp. 1762-1768, Nov. 1995.

O'Sullivan, "*A Generalization of the Berlekamp-Massey-Sakata Algorithm*", http://www-rohan.sdsu.edu/~mosulliv/research.html, preprint, pp. 1-25, Jun. 2001.

* cited by examiner

DECODING FOR ALGEBRAIC GEOMETRIC CODE ASSOCIATED WITH A FIBER PRODUCT

This application claims priority from French Patent Application No. 04 00 267 filed on Jan. 13, 2004, which is incorporated herein by reference.

FIELD OF THE INVENTION

The present invention concerns systems for communication or recording of data in which the data are subjected to a channel encoding in order to improve the fidelity of the transmission or storage. It concerns more particularly a decoding method, as well as the devices and apparatus adapted to implement this method.

BACKGROUND OF THE INVENTION

It will be recalled that channel "block encoding" consists, when the "codewords" sent to a receiver or recorded on a data carrier are formed, of introducing a certain level of redundancy in the data. More particularly, by means of each codeword, the information is transmitted that is initially contained in a predetermined number k of symbols taken from an "alphabet" of finite size q; on the basis of these k information symbols, calculation is made of a number n>k of symbols belonging to that alphabet, which constitute the components of the codewords: $v=(v_1, v_2, \ldots, v_n)$. The set of codewords obtained when each information symbol takes some value in the alphabet constitutes a sort of dictionary referred to as a "code" of "dimension" k and "length" n.

When the size q of the "alphabet" is a power of a prime number, the alphabet can be given the structure of what is known as a "Galois field", denoted $F_q$, of which the non-zero elements may conveniently be identified as each being equal to $\gamma^i$ for a corresponding value of i, where $i=1, \ldots, q-1$, and where $\gamma$ is a primitive $(q-1)^{th}$ root of unity in $F_q$.

In particular, certain codes, termed "linear codes" are such that any linear combination of codewords (with the coefficients taken from the alphabet) is still a codeword. These codes may conveniently be associated with a matrix H of dimension (n−k)×n, termed "parity check matrix": a word v of given length n is a codeword if, and only if, it satisfies the relationship: $H \cdot v^T = 0$ (where the exponent T indicates the transposition); the code is then said to be "orthogonal" to the matrix H.

At the receiver, the associated decoding method then judiciously uses this redundancy to detect any transmission errors and if possible to correct them. There is a transmission error if the difference e between a received word r and the corresponding codeword v sent by the transmitter is non-zero.

More particularly, the decoding is carried out in two main steps.

The first step consists of associating an "associated codeword" with the received word. To do this, the decoder first of all calculates the "error syndromes" vector $s = H \cdot r^T = H \cdot e^T$. If the syndromes are all zero, it is assumed that no transmission error has occurred, and the "associated codeword" will then simply be taken to be equal to the received word. If that is not the case, it is thereby deduced that the received word is erroneous, and a correction algorithm is then implemented which is adapted to estimate the value of the error e; the algorithm will thus provide an estimated value ê such that (r−ê) is a codeword, which will then constitute the associated codeword. Usually, this first step is divided into two substeps: first identification is made of what the components are in the received word whose value is erroneous, and then the corrected value of those components is calculated.

The second step simply consists in reversing the encoding method. In the ideal situation in which all the transmission errors have been corrected, the initial information symbols are thereby recovered.

It will be noted that in the context of the present invention, reference will often be made to "decoding" for brevity, to designate solely the first of those steps, it being understood that the person skilled in the art is capable without difficulty of implementing the second step.

The purpose of an error correction algorithm is to associate with the received word the codeword situated at the shortest Hamming distance from that received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to INT[(d−1)/2] (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance. It should also be noted that, when the chosen algorithm manages to propose a correction for the received word, that correction is all the more reliable (at least, for most transmission channels) the smaller the number of positions it concerns.

Among known codes, "Reed-Solomon" codes may be cited, which are reputed for their efficiency. They are linear codes, of which the minimum distance d is equal to (n−k+1). The parity check matrix H of the Reed-Solomon code of dimension k and length n (where n is necessarily equal to (q−1) or to a divisor of (q−1)) is a matrix with (n−k) lines and n columns, which has the structure of a Vandermonde matrix. This parity check matrix H may for example be defined by taking $H_{ij} = \alpha^{(i+1)j}$ ($0 \leq i \leq n-k-1$, $0 \leq j \leq n-1$), where $\alpha$ is an $n^{th}$ root of unity in $F_q$. For more details on Reed-Solomon codes, reference may for example be made to the work by R. E. Blahut entitled "*Theory and practice of error-control codes*", Addison-Wesley, Reading, Mass., 1983; this work provides in particular the description of the "Berlekamp-Massey" algorithm which enables the erroneous components in a received word to be identified, and of the "Forney" algorithm which then enables the value of those erroneous components to be corrected.

For modern information carriers, for example on computer hard disks, CDs ("compact discs") and DVDs ("digital video discs"), it is sought to increase the density of information. When such a carrier is affected by a physical defect such as a scratch, a high number of information symbols may be rendered unreadable. This problem may nevertheless be remedied by using a very long code. However, as indicated above, the length n of the words in Reed-Solomon codes is less than the size q of the alphabet of the symbols. Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, it has been sought to build codes which naturally provide words of greater length than Reed-Solomon codes.

In particular so-called "algebraic geometric codes" or "Goppa geometric codes" have recently been proposed (see for example "*Algebraic Geometric Codes*" by par J. H. van Lint, in "*Coding Theory and Design Theory*" 1st part, *IMA Volumes Math. Appl.*, volume 20, Springer-Verlag, Berlin, 1990). These codes are constructed from a set of n pairs (x,y) of symbols belonging to a chosen Galois field $F_q$; this set of pairs is termed a "locating set". In general terms, there is an algebraic equation with two unknowns X and Y such that the pairs (x,y) of that locating set are all solutions of that algebraic equation. The values of x and y of these pairs may be considered as coordinates of points $P_j$ (where j =1, . . . , n) forming an "algebraic curve".

An important parameter of such a curve is its "genus" g. In the particular case where the curve is a simple straight line (the genus g s then zero), the algebraic geometric code reduces to a Reed-Solomon code. For given q and g, certain algebraic curves, termed "maximum", make it possible to achieve a length equal to $(q+2g\sqrt{q})$, which may be very high; for example, with an alphabet size of 256 and a genus equal to 120, codewords are obtained of length 4096.

For a "one point" algebraic geometric code a parity check matrix is conventionally defined as follows: With every monomial $h=X^s Y^t$, where s and t are positive integers or zero, a "weight" is associated (see below for details). If, for an integer $\rho \geq 0$, there is at least one monomial of which the weight is $\rho$, it is said that $\rho$ is an "achievable" weight. Let $\rho_1 < \rho_2 < \ldots < \rho_{n-k}$ be the (n–k) smallest achievable weights, and let $h_i$ (where i=1, . . . , n–k) be a monomial of weight $\rho_i$. The element in line i and column j of the parity check matrix is equal to the monomial $h_i$ evaluated at the point $P_j$ (where, it may be recalled, j=1, . . . , n) of the algebraic curve. Each point $P_j$ then serves to identify the $j^{th}$ component of any codeword.

Algebraic geometric codes are advantageous as to their minimum distance d, which is at least equal to (n–k+1–g), and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capability of the decoder (see for example the article by Tom Høholdt and Ruud Pellikaan entitled "*On the Decoding of Algebraic-Geometric Codes*", *IEEE Trans. Inform. Theory*, vol. 41 no. 6, pages 1589 to 1614, November 1995). Generally, the higher the genus g of the algebraic curve used, the greater the length of the codewords, but also the greater the complexity of the decoding.

A decoding algorithm for algebraic geometric codes is known, for example, from the article by A. N. Skorobogatov and S. G. Vladut entitled "*On the Decoding of Algebraic-Geometric codes*", *IEEE Trans. Inform. Theory*, vol. 36 no.5, pages 1051 to 1060, September 1990).

Another example of an algorithm is disclosed in the article by M. Sakata et al. entitled "*Generalized Berlekamp-Massey Decoding of Algebraic-Geometric Codes up to Half the Feng-Rao Bound*" (IEEE Trans. Inform. Theory, vol 41, pages 1762 to 1768, November 1995). This algorithm can be viewed as a generalization of the Berlekamp-Massey algorithm to algebraic geometric codes defined on a curve of non-zero genus.

Still another example is disclosed in the article by M. O'Sullivan entitled "*A Generalization of the Berlekamp-Massey-Sakata Algorithm*" (preprint 2001).

SUMMARY OF THE INVENTION

However, the authors of the present invention have discovered that it is possible to reconcile the apparently contradictory properties of high genus g and low decoding complexity, where the algebraic curve is of a particular type belonging to the general class of "fiber products", which will now be defined.

Let there be a certain number $\mu$, where $\mu$ is an integer greater than 1, of algebraic equations over $F_q$, where $q=2^{2p}$ and p is a strictly positive integer, all having, for i=0, . . . , $\mu-1$, the same general formula $$Y_i^e + Y_i = \beta_i f(X) \tag{1.i}$$

governing the unknowns X and $Y_i$, and where:
  $e=2^\phi$, where $\phi$ is a strictly positive integer,
  f(X) is a polynomial of odd degree in X,
  the $\beta_i$ are elements of $F_{q'}$, where $q'=2^p$, which are linearly independent over $F_2$, and
  $2^{\mu\phi} \leq 2^p$.
Next let $$Z = \sum_{i=0}^{\mu-1} \lambda_i Y_i, \tag{2}$$

in which the coefficients $\lambda_i$ belong to $F_q$ and are all non-zero.

Finally the $Y_i$ are eliminated between the equations (1.i) and equation (2), and the coefficients $\lambda_i$ are chosen such that this elimination results in an equation of the form $$g(Z) = \beta f(X), \tag{3}$$

in which the $\beta$ belongs to $F_q$. In the context of the present invention, equation (3) will be termed the "fiber product" of the equations (1.i) and the latter will be termed "component equations" of the fiber product (3). It can be shown that in equation (3), g(Z) is a polynomial in Z of degree $2^{\mu\phi}$ of which the coefficients are zero for the powers of Z which are not equal to a power of $e=2^\phi$; the result of this in particular is that equation (3) is of the type "C(a,b)", defined below, and that the algebraic geometric code defined on that equation is a one-point code.

According to a first aspect, the invention thus concerns a method of decoding a one-point algebraic geometric code defined on an algebraic curve represented by an equation in X and Z of degree $2^{\mu\phi}$ in Z, where $\phi$ is a strictly positive integer and $\mu$ an integer greater than 1, obtained by taking the fiber product of $\mu$ component algebraic equations, each of said component equations governing the unknown X and an unknown $Y_i$, where i=0, . . . , $\mu-1$, and being of degree $2^\phi$ in $Y_i$. This method is remarkable in that it comprises the decoding of $2^{(\mu-1)\phi}$ "clustered" codes, all defined on the same algebraic curve represented by one of said component equations.

As explained in detail below, the method according to the invention relies on the subdivision of the locating set of the code into subsets which we will refer to as "clusters". By definition, a "cluster" is associated with a given value of x among the solutions of equation (3) and with a given value of $y_0$ among the solutions of equation (1.0), the other coordinates $y_1, y_2, \ldots, y_{\mu-1}$ being able to take all the values which are respectively solutions to the equations (1.i) where $i \neq 0$ (it is naturally possible to exchange the role of $Y_0$ with that of any other unknown $Y_i$, where $i \neq 0$). Each "cluster" according to the invention thus comprises at most $2^{(\mu-1)\phi}$ points of the locating set.

By virtue of the invention, the decoding of received words resulting from the transmission of words of great length, encoded in accordance with a code of high genus defined on a geometric curve represented by a fiber product, is being replaced by the less complex decoding of "clustered codes" defined on an algebraic curve represented by an equation of lower degree than the degree of the fiber product, and thus generally also of lower genus. These clustered codes being defined on the same general algebraic curve, they are of the same length, which is, as will be seen in the examples presented below, often considerably less than the length of the code defined on the algebraic curve represented by the fiber product.

It will be seen below, with the help of an example embodiment, that the method of decoding according to the invention makes it possible to correct sometimes more, and sometimes less transmission errors than the conventional methods such as that of O'Sullivan, depending on the manner in which the errors are produced by the channel: in this respect, the method according to the invention is advantageous when the channel produces burst-type errors rather than randomly occurring errors.

According to particular features, a word r having been received, the decoding method comprises the following steps:

for $s=0, \ldots, 2^{(\mu-1)\phi}-1$:

calculating the "clustered received word" $r_s$ of which each component $r_s(x,y_0)$ is a linear combination of the components of r indexed by the pair $(x,y_0)$, and is "erased" if at least one of those components is considered as doubtful by the receiver, and calculating the error syndromes vector $\sigma_s = H^{(s)} r_s^T$, where the matrix $H^{(s)}$ is the parity check matrix of a clustered code, attempting to calculate a word $\hat{v}_0$ by correcting the word $r_0$ according to the error syndromes vector $\sigma_0$ by means of an error correction algorithm adapted to take into account the "erasures", for $s=1, \ldots, 2^{(\mu-1)\phi}-1$:

where the preceding error correction attempt has succeeded, erasing, for each pair $(x,y_0)$ such that $\hat{v}_0(x,y_0) \neq r_0(x,y_0)$, the symbols $r_l(x,y_0)$ for $l=s, \ldots, 2^{(\mu-1)\phi}-1$, and attempting to calculate a word $\hat{v}_s$ by correcting the word $r_s$ according to the error syndromes vector $\sigma_s$ by means of an error correction algorithm adapted to take into account the "erasures", and where the above $2^{(\mu-1)\phi}$ correction attempts have succeeded, calculating, for each cluster of components of r indexed by a pair $(x,y_0)$, the estimated values of the components of the corresponding transmitted word indexed by that pair $(x,y_0)$, by solving a system of $2^{(\mu-1)\phi}$ linear equations using the symbols $\hat{v}_s(x,y_0)$, where $s=0, \ldots, 2^{(\mu-1)\phi}-1$.

By virtue of these provisions, it is possible to optimize the error correction capability of the decoding method according to the invention, by taking into account the "erasures", that is to say by taking advantage of the information that the value of a particular component of the word to correct is uncertain.

According to a second aspect, the invention relates to various devices.

Thus, firstly, it concerns a device for correcting errors for the decoding of a one-point algebraic geometric code defined on an algebraic curve represented by an equation in X and Z of degree $2^{\mu\phi}$ in Z, where $\phi$ is a strictly positive integer and $\mu$ an integer greater than 1, obtained by taking the fiber product of $\mu$ component algebraic equations, each of said component equations governing the unknown X and an unknown $Y_i$, where $i=0, \ldots, \mu-1$, and being of degree $2^\phi$ in $Y_i$. This device is remarkable in that it comprises means for decoding $2^{(\mu-1)\phi}$ "clustered" codes, all defined on the same algebraic curve represented by one of said component equations.

According to particular features, the error correction device comprises means which, a word r having been received, are for:

calculating, for $s=0, \ldots, 2^{(\mu-1)\phi}-1$, the "clustered received word" $r_s$ of which each component $r_s(x,y_0)$ is a linear combination of the components of r indexed by the pair $(x,y_0)$ and is erased if at least one of those components is considered as doubtful by the receiver, and calculating the error syndromes vector $\sigma_s = H^{(s)} r_s^T$, where the matrix $H^{(s)}$ is the parity check matrix of a clustered code, attempting to calculate a word $\hat{v}_0$ by correcting the word $r_0$ according to the error syndromes vector $\sigma_0$ by means of an error correction algorithm adapted to take into account the erasures, where, for $s=1, \ldots, 2^{(\mu-1)\phi}-1$, the preceding error correction attempt has succeeded, erasing, for each pair $(x,y_0)$ such that $\hat{v}_0(x,y_0) \neq r_0(x,y_0)$, the symbols $r_l(x,y_0)$ for $l=s, \ldots, 2^{(\mu-1)\phi}-1$, and attempting to calculate a word $\hat{v}_s$ by correcting the word $r_s$ according to the error syndromes vector $\sigma_s$ by means for an error correction algorithm adapted to take into account the erasures, and where the above $2^{(\mu-1)\phi}$ correction attempts have succeeded, calculating, for each cluster of components of r indexed by a pair $(x,y_0)$, the estimated values of the components of the corresponding transmitted word indexed by that pair $(x,y_0)$, by solving a system of $2^{(\mu-1)\phi}$ linear equations using the symbols $\hat{v}_s(x,y_0)$, where $s=0, \ldots, 2^{(\mu-1)\phi}-1$.

The advantages of these error correction devices are essentially the same as those of the methods complementary thereto described succinctly above.

The invention also concerns, secondly, a decoder comprising:

at least one error correction device as described succinctly above, and at least one redundancy removal device.

The invention also relates to:

an apparatus for receiving encoded digital signals comprising a decoder as succinctly described above, as well as means for demodulating said encoded digital signals, a computer system comprising a decoder as succinctly described above, and further comprising at least one hard disk, and at least one means for reading that hard disk, a non-removable data storage means comprising computer program code instructions for the execution of the steps of any one of the methods succinctly described above, a partially or wholly removable data storage means comprising computer program code instructions for the execution of the steps of any one of the methods succinctly described above, and a computer program containing instructions such that, when said program controls a programmable data processing device, said instructions lead to said data processing device implementing one of the methods succinctly described above.

The advantages provided by this decoder, this reception apparatus, this computer system, these data storage means and this computer program are essentially the same as those provided by the methods according to the invention.

BRIEF DESCRIPTION OF THE FIGURES

Other aspects and advantages of the invention will emerge from a reading of the following detailed description of particular embodiments, given by way of non-limiting example. The description refers to the accompanying drawings, in which.

DETAILED DESCRIPTION OF A PREFERRED EMBODIMENT

Figure 1:
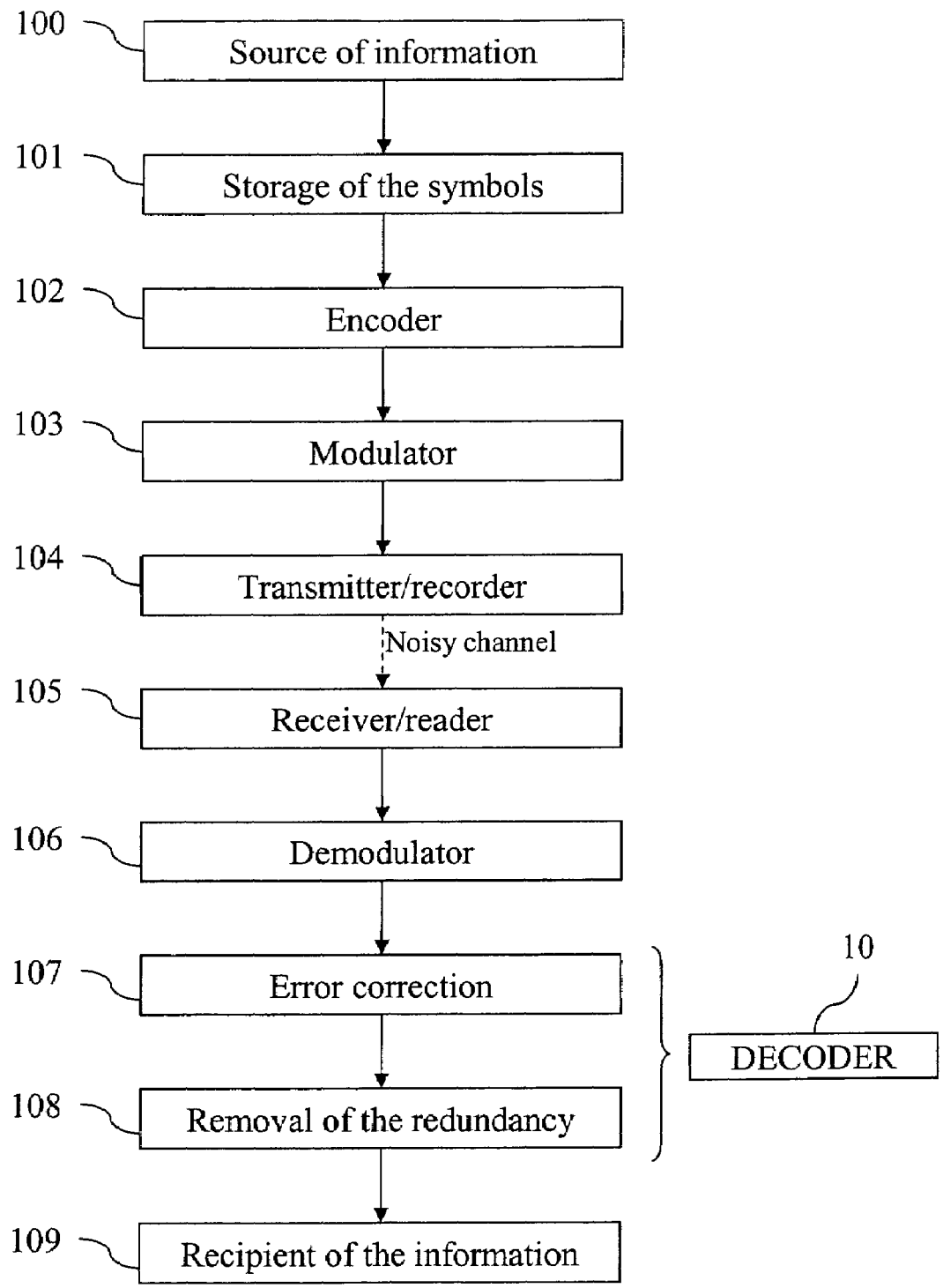
FIG. 1 is a block diagram of a system for transmitting information using a decoder according to the invention.

FIG. 1 is a block diagram of a system for transmitting information using a channel encoding and decoding according to the invention.

The function of this system is to transmit information of any nature from a source 100 to a recipient or user 109. First of all, the source 100 puts this information into the form of symbols belonging to a certain alphabet (for example bytes), and transmits these symbols to a storage unit 101, which accumulates the symbols so as to form sets each containing k symbols. Next, each of these sets is transmitted by the storage unit 101 to an encoder 102 which incorporates the redundancy therein, so as to construct a codeword of length n belonging to the chosen code.

The codewords so formed are next transmitted to a modulator 103, which associates a modulation symbol (for example, a complex amplitude) with each symbol of the codeword. Next, these modulation symbols are transmitted to a transmitter or to a recorder 104, which inserts the symbols in a transmission channel. This channel may for example be constituted by a wired transmission or wireless transmission such as a radio signal, or by storage on an appropriate carrier such as a DVD or a magnetic tape. This transmission arrives at a receiver or a reader 105, after having been affected by a "transmission noise" whose effect is to modify or delete certain of the modulation symbols at random.

The receiver (or reader) 105 then transmits these symbols to the demodulator 106, which transforms them into symbols of the alphabet mentioned above. The n symbols resulting from the transmission of the same codeword are next grouped together into a "received word" in an error correction unit 107, which implements a decoding method according to the invention, so as to provide an "associated codeword". Next, this associated codeword is transmitted to a redundancy removal unit 108, which extracts from it k information symbols by implementing a decoding algorithm that is the reverse of that implemented by the encoder 102. Finally, these information symbols are supplied to their recipient 109.

Units 107 and 108 can be considered to form conjointly a "decoder" 10.

The method of error correction according to the invention will now be illustrated, with the aid of a numerical example. Note that this example does not necessarily constitute a preferred choice of parameters for the encoding or decoding. It is provided here to enable the person skilled in the art to understand more easily the operation of the method according to the invention.

An algebraic geometric code will thus be considered of dimension 2953 and length 3264 defined as follows.

The alphabet of the symbols is constituted by the $2^{10}$ elements of the Galois field $F_{1024}$. The following "algebraic curve" is then considered of genus g=35 constituted by the set of the solutions (X=x,Z=z) of the equation with two unknowns $$Z^8 + \beta^{17} Z^4 + \beta^5 Z^2 + \beta^{10} Z + \beta^{11} X^{11} = 0 \tag{99}$$

over $F_{1024}$, where $\beta = \alpha^{33}$ is an element of $F_{32}$ and $\alpha$ is an element of $F_{1024}$ satisfying $$\alpha^{10} + \alpha^3 + 1 = 0.$$

These solutions (x,z) of equation (99), of which there are 3264 (i.e. $(q+2g\sqrt{q})$, this algebraic curve thus being "maximum"), constitute the "finite points of the curve" (the curve also contains a point at infinity denoted $P_\infty$) and will constitute the locating set. Each point $P_j$ of the locating set serves to identify the $j^{th}$ component of any codeword. The number of such points here being equal to 3264, the length n of the code is thus itself also equal to 3264.

It will be noted that the algebraic curve (99) is of the general form:

$$X^b + cZ^a + \Sigma c_{ij} X^i Z^j = 0,$$

where c≠0 and the $c_{ij}$ are elements of $F_q$, a and b are strictly positive mutually prime integers, and where the sum only applies to the integers i and j which satisfy ai+bj<ab. This form of equation is referred to as "C(a,b)".

Furthermore, it is possible to verify that the algebraic equation (99) is the fiber product of the following algebraic equations:

$$Y_0^2 + Y_0 + X^{11} = 0, \tag{100}$$

$$Y_1^2 + Y_1 + \beta X^{11} = 0, \text{ et} \tag{101}$$

$$Y_2^2 + Y_2 + \beta^2 X^{11} = 0, \tag{102}$$

which are themselves of type C(a,b) (more particularly, they are equations known as "hyperelliptic" since they are quadratic in $Y_0$, $Y_1$ and $Y_2$). This fiber product is obtained by eliminating the unknowns $Y_0$, $Y_1$ and $Y_2$ between the three equations (100-102) and the following equation:

$$Z = Y_0 + \beta^{20} Y_1 + \beta^7 Y_2. \tag{103}$$

This example thus does indeed fall within the scope of the invention, with, in this case: p=5, φ=1 and μ=3.

There are 672 values x of X in $F_{1024}$ for which there exist two values of $y_0$ of $Y_0$ in $F_{1024}$ such that the pair $(X=x, Y_0=y_0)$ satisfies the equation (100) (for the 352 other values x of X in $F_{1024}$, there is no other value $y_0$ of $Y_0$ in $F_{1024}$ such that the pair $(X=x, Y_0=y_0)$ satisfies the equation (100)). Similarly, there are 672 values x of X in $F_{1024}$ for which there exist two values $y_1$ of $Y_1$ in $F_{1024}$ such that the pair $(X=x, Y_1=y_1)$ satisfies the equation (101) (for the 352 other values x of X in $F_{1024}$, there is no other value $y_1$ of $Y_1$ in $F_{1024}$ such that the pair $(X=x, Y_1=y_1)$ satisfies the equation (101)). Similarly, there are 672 values x of X in $F_{1024}$ for which there exist two values $y_2$ of $Y_2$ in $F_{1024}$ such that the pair $(X=x, Y_2=y_2)$ satisfies the equation (102) (for the 352 other values x of X in $F_{1024}$, there is no other value of $y_2$ of $Y_2$ in $F_{1024}$ such that the pair $(X=x, Y_2=y_2)$ satisfies the equation (102)). The intersection of these three sets of values of x comprises 408 elements, on the basis of which a total number of multiplets $(x, y_0, y_1, y_2)$ is obtained equal to: 408×2×2×2=3264, which is indeed equal to the number of solutions (x,z) of the equation (99).

For an algebraic equation of the C(a,b) type, the monomials $h_i = Z^t X^u$ are usually considered where the exponent t of Z is strictly less than a, and the "weight" of such a monomial is defined by ρ(t,u)=bt+au. Next, the vector space L(m $P_\infty$) is considered of the polynomials in X and Z with coefficients in $F_{1024}$ of which solely the poles are situated in $P_\infty$, and are of order less than or equal to m, where m is a strictly positive integer (the image of this space of polynomials on the finite points of a curve C(a,b) is thus a "one-point" algebraic geometric code). This vector space, which is of dimension greater than or equal to (m−g+1) (equal if m>2g−2), has a base constituted by the monomials $h_i = Z^t X^u$, where t is an integer between 0 and a, u is a positive integer or zero, and $\rho(t,u) \leq m$.

Take for example: m=345; by taking into account g=35, a set of monomials $h_i$, where i=1, ..., 311, is then obtained since:

$$m-g+1 = 345-35+1 = 311.$$

Finally, the parity check matrix H of the code is defined in the following manner: the element in line i and column j of that matrix is equal to the value taken by the monomial $h_i$ for the coordinates of the point $P_j$ of the algebraic curve. Thus, n−k=311 and so k=2953.

The monomials $h_i$ may be classified into subsets of monomials $$M_t = \{Z^t X^u | 0 \leq u \leq (m-bt)/a\},$$

where $t \geq 0$, t<a, and $t \leq m/b$. In the case of the equation (99), where a=8 and b=11, and for m=345, eight such subset of monomials are obtained:

$M_0 = \{X^u | 0 \leq u \leq 43\}$, with a maximum weight of $\rho(0,43)=344$, $M_1 = \{ZX^u | 0 \leq u \leq 41\}$ with a maximum weight of $\rho(1,41)=339$, $M_2 = \{Z^2 X^u | 0 \leq u \leq 40\}$ with a maximum weight of $\rho(2,40)=342$, $M_3 = \{Z^3 X^u | 0 \leq u \leq 39\}$ with a maximum weight of $\rho(3,39)=345$, $M_4 = \{Z^4 X^u | 0 \leq u \leq 37\}$ with a maximum weight of $\rho(4,37)=340$, $M_5 = \{Z^5 X^u | 0 \leq u \leq 36\}$ with a maximum weight of $\rho(5,36)=343$, $M_6 = \{Z^6 X^u | 0 \leq u \leq 34\}$ with a maximum weight of $\rho(6,34)=338$, and $M_7 = \{Z^7 X^u | 0 \leq u \leq 33\}$ with a maximum weight of $\rho(7,33)=341$.

It is verified that the number of lines of the parity check matrix H is indeed equal to: 44+42+41+40+38+37+35+34=311.

A new formulation for belonging to the code will now be presented, which is equivalent to the orthogonal relationship $H \cdot v^T = 0$, and which then facilitate the understanding of the decoding method according to the invention.

This new formulation relies on the subdivision of the locating set of the code into subsets which we will term "clusters". By definition, a cluster is associated with a value x of X and with a value $y_0$ of—let us say—$Y_0$. In the present example, as the coordinate $Y_1$ can take the values $y_{11}$ or $y_{12}$, and the coordinate $y_2$ can take the values $y_{21}$ and $y_{22}$, the 3264 points of the locating set form 816 clusters each comprising four points. The components of any codeword v will then be denoted $v(y_0, y_{1i}, y_{2j}, z(y_0, y_{1i}, y_{2j}, x))$, where i,j=1,2, so as to emphasize the cluster structure, and it will be stated that the components, indexed for that purpose, which have the same value of x and of $y_0$ form a "cluster of components" of the codeword.

Next, for each cluster, four "clustered symbols" are defined $$v_s(x, y_0) = \sum_{\substack{i=1,2 \\ j=1,2}} [z(y_0, y_{1i}, y_{2j}, x)]^s v(y_0, y_{1i}, y_{2j}, z(y_0, y_{1i}, y_{2j}, x))$$

for s=0,1,2,3. These clustered symbols then constitute, for each value of s, the components of a "clustered word" $\underline{v}_s$ of length 816.

It will now be shown that the condition $H \cdot v^T = 0$ of belonging to the code is equivalent to the four conditions $H^{(s)} \cdot v_s^T = 0$ (where s=0,1,2,3), where each matrix $H^{(s)}$ is the parity check matrix of a code of length n'=816 and of dimension $k'_s$ defined on the algebraic curve represented by the hyperelliptic equation (100), which is of genus g'=5. Given the exponents of X and of $Y_0$ in the equation (100), the parity check matrix of such a code may be constructed on the basis of the monomials $Y_0^t X^u$ of weight $\rho'(t,u) = 11t + 2u$. More particularly, it will be shown that:

for $H^{(0)}$, the space of the polynomials is $L(m'_0 P_\infty)$ with $m'_0 = 86$; it is thus of dimension $k'_0 = n' - m'_0 + g' - 1 = 734$;

for $H^{(1)}$ the space of the polynomials is $L(m'_1 P_\infty)$ with $m'_1 = 83$; it is thus of dimension $k'_1 = n' - m'_1 + g' - 1 = 737$;

for $H^{(2)}$ the space of the polynomials is $L(m'_2 P_\infty)$ with $m'_2 = 80$; it is thus of dimension $k'_2 = n' - m'_2 + g' - 1 = 740$; and for $H^{(3)}$ the space of the polynomials is $L(m'_3 P_\infty)$ with $m'_3 = 78$; it is thus of dimension $k'_3 = n' - m'_3 + g' - 1 = 742$.

It will be noted that, whatever the formulation chosen for the encoding, the total dimension of the code must be conserved since that dimension reflects the number of degrees of freedom available for that encoding. Verification is made that this is indeed the case with the values below:

$$k'_0 + k'_1 + k'_2 + k'_3 = 734 + 737 + 740 + 742 = 2953 = k.$$

The algebraic codes so obtained are termed "clustered" codes associated with the code defined on the algebraic curve represented by the equation (99).

To construct this equivalence, the concept of "weight" (standard in the general context of the theory of algebraic geometric codes) is generalized to the polynomials with two variables X and Z comprising at least two monomials: first the weight $\rho(t,u) = bt + au$ of each monomial $Z^t X^u$ of that polynomial is calculated, and then it is verified whether the greatest weight so calculated is in respect of a unique monomial; if that is the case, a weight equal to that maximum weight is then attributed to the polynomial, otherwise the available algebraic equations are used to achieve that case.

Thus: $\rho(Y_0^2 + Y_0) = \rho(Y_0^2) = 2\rho(Y_0)$ However, according to equation (100):

$$\rho(Y_0^2 + Y_0) = \rho(X^{11}) = 11 \cdot \rho(X) = 88$$

taking into account that $\rho(X) = a = 8$. It is deduced from this that: $\rho(Y_0) = 44$, which is furthermore equal to $\rho(Z^4) = 4 \cdot \rho(Z) = 44$, taking into account that $\rho(Z) = b = 11$.

This result $\rho(Z^4) = \rho(Y_0)$ is used as justification for replacing $Z^4$ with $Y_0$ in the subset of monomials $M_4$, $M_5$, $M_6$, and $M_7$, which gives:

$M'_4 = \{Y_0 X^u | 0 \leq u \leq 37\}$, $M'_5 = \{ZY_0 X^u | 0 \leq u \leq 36\}$, $M'_6 = \{Z^2 Y_0 X^u | 0 \leq u \leq 34\}$, and $M'_7 \{Z^3 Y_0 X^u | 0 \leq u \leq 33\}$.

Next, the parity check matrix H' is defined that is constructed on the basis of the monomials contained in the subsets $M_0$, $M_1$, $M_2$, $M_3$, $M'_4$, $M'_5$, $M'_6$, and $M'_7$. In the general context of the theory of algebraic geometric codes, it can be shown that the matrices H and H' define the same code, that is to say that the equation $H \cdot \underline{v}^T=0$ is equivalent to the equation $H' \cdot \underline{v}^T=0$.

Next, a matrix $H'_0$ is defined on the basis of H' by deleting the lines corresponding to the monomials belonging to $M_1$, $M_2$, $M_3$, $M'_5$, $M'_6$, and $M'_7$; similarly, a matrix $H'_1$ is defined on the basis of H' by deleting the lines corresponding to the monomials belonging to $M_0$, $M_2$, $M_3$, $M'_4$, $M'_6$, and $M'_7$; a parity check matrix $H'_2$ is defined on the basis of H' by deleting the lines corresponding to the monomials belonging to $M_0$, $M_1$, $M_3$, $M'_4$, $M'_5$, and $M'_7$; and finally a parity check matrix $H'_3$ is defined on the basis of H' by deleting the lines corresponding to the monomials belonging to $M_0$, $M_1$, $M_2$, $M'_4$, $M'_5$ and $M'_6$.

The result of these manipulations is that a word v obeys $H' \cdot \underline{v}^T=0$ (that is to say, belongs to the code defined on the algebraic curve represented by the equation (99)) if, and only if, it obeys the four equations $$H'_0 \cdot \underline{v}^T=0, H'_1 \cdot \underline{v}^T=0, H'_2 \cdot \underline{v}^T 0 \text{ and } H'_3 \cdot \underline{v}^T=0$$

simultaneously.

Finally, it is found that, within $H'_0$, each column appears identically four times, since the monomials of $M_0$ and $M'_4$ are independent from $Y^1$ and $Y^2$. A matrix $H^{(0)}$ is then defined, of dimension $(44+38) \times 816$, obtained from $H'_0$ by keeping only a single copy for each group of four identical columns, such that, obviously, $$H'_0 \cdot \underline{v}^T = H^{(0)} \cdot \underline{v}^T,$$

where $\underline{v}_0$ has been defined above; similarly there is obtained $$H'_1 \cdot \underline{v}^T = H^{(1)} \cdot \underline{v}_1^T,$$

where $v_1$ has been defined above, and where the matrix $H^{(1)}$, of dimension $(42+37) \times 816$, is obtained from $H'_1$ by deleting the factor Z in the monomials, and by keeping only a single copy for each group of four identical columns; there is obtained $$H'_2 \cdot \underline{v}^T = H^{(2)} \cdot \underline{v}_2^T,$$

where $v_2$ has been defined above, and where the matrix $H^{(2)}$, of dimension $(41+35) \times 816$, is obtained from $H'_2$ by deleting the factor $Z^2$ in the monomials, and by keeping only a single copy for each group of four identical columns; and there is obtained $$H'_3 \cdot \underline{v}^T = H^{(3)} \cdot \underline{v}_3^T,$$

where $v_3$ has been defined above, and where the matrix $H^{(3)}$, of dimension $(40+34) \times 816$, is obtained from $H'_3$ by deleting the factor $Z^3$ in the monomials, and by keeping only a single copy for each group of four identical columns.

By virtue this reformulation, the invention makes it possible to replace the decoding of received words resulting from the transmission of words of great length, encoded in accordance with a code of high genus defined on a geometric curve represented by a fiber product, by the less complex decoding of "clustered codes" defined on an algebraic curve of lower degree. Furthermore, in the particular case which has just been described in detail, the clustered codes associated with the parity check matrices $H^{(0)}$, $H^{(1)}$, $H^{(2)}$ and $H^{(3)}$ are hyperelliptic codes, which are known for being particularly simple to decode (see the article by A. N. Skorobogatov and S. G. Vlădut cited above).

According to an embodiment of the invention, a received word r of length n=3264 is corrected taking into account the erasures. The components of any received word r will then be denoted $r(y_0, y_{1i}, y_{2j}, z(y_0, y_{1i}, y_{2j}, x))$, where $i,j=1,2$, and it will be stated that the components, indexed for that purpose, which have the same value of x and of $y_0$ form a "cluster of components of the received word".

Firstly, for s=0,1,2,3:

calculation is made of the "clustered received word" $\underline{r}_s$, of length 816, of which each component $$r_s(x, y_0) = \sum_{\substack{i=1,2 \\ j=1,2}} [z(y_0, y_{1i}, y_{2j}, x)]^s r(y_0, y_{1i}, y_{2j}, z(y_0, y_{1i}, y_{2j}, x))$$

is erased if at least one of the 4 symbols $r(y_0, y_{1i}, y_{2j}, z(y_0, y_{1i}, y_{2j}, x))$ is considered as doubtful by the receiver, and the error syndromes vector $\underline{\sigma}_s = H^{(s)} \underline{r}_s^T$ is calculated, where the matrices $H^{(s)}$ are those which have been defined above.

Next, an attempt is made to calculate a word $\hat{v}_0$ by correcting the word $\underline{r}_0$ according to the error syndromes vector $\underline{\sigma}_0$ by means of a conventional error correction algorithm for algebraic geometric codes, adapted to take into account the erasures (see the article by Tom Høholdt and Ruud Pellikaan cited above).

If that algorithm has not been able to provide a corrected word, it is thereby concluded that the means implemented do not enable that received word to be corrected, due to too high a number of transmission errors; the operations following (for example, replacing the word with a predetermined word such as the zero word) depend on the applications envisaged for the decoding method.

If, on the other hand, the correction algorithm is capable of proposing a word $\hat{v}_0$, then for every pair $(x, y_0)$ such that $\hat{v}_0(x, y_0) \neq r_0(x, y_0)$, the symbols $r_1(x, y_0)$ are erased for l=1,2,3.

Next, an attempt is made to calculate a word $\hat{v}_1$ by correcting the word $\underline{r}_1$ according to the error syndromes vector $\underline{\sigma}_1$ by means of a conventional error correction algorithm for algebraic geometric codes, adapted to take into account the erasures.

If that algorithm has not been able to provide a corrected word, it is thereby concluded that the means implemented do not enable that received word to be corrected, due to too high a number of transmission errors; the operations following (for example, replacing the word with a predetermined word such as the zero word) depend on the applications envisaged for the decoding method.

If, on the other hand, the correction algorithm is capable of proposing a word $\hat{v}_1$, then for every pair $(x, y_0)$ such that $\hat{v}_1(x, y_0) \neq r_1(x, y_0)$, the symbols $r_1(x, y_0)$ are erased for l=2,3.

Next, an attempt is made to calculate a word $\hat{v}_2$ by correcting the word $\underline{r}_2$ according to the error syndromes vector $\underline{\sigma}_2$ by means of a conventional error correction algorithm for algebraic geometric codes, adapted to take into account the erasures.

If that algorithm has not been able to provide a corrected word, it is thereby concluded that the means implemented do not enable that received word to be corrected, due to too high a number of transmission errors; the operations following (for example, replacing the word with a predetermined word such as the zero word) depend on the applications envisaged for the decoding method.

If, on the other hand, the correction algorithm is capable of proposing a word $\hat{v}_2$, then for every pair $(x,y_0)$ such that $\hat{v}_2(x,y_0) \neq r_2(x,y_0)$, the symbols $r_3(x,y_0)$ are erased.

Next, an attempt is made to calculate a word $\hat{v}_3$ by correcting the word $r_3$ according to the error syndromes vector $\sigma_3$ by means of a conventional error correction algorithm for algebraic geometric codes, adapted to take into account the erasures.

If that algorithm has not been able to provide a corrected word, it is thereby concluded that the means implemented do not enable that received word to be corrected, due to too high a number of transmission errors; the operations following (for example, replacing the word with a predetermined word such as the zero word) depend on the applications envisaged for the decoding method.

If on the other hand the correction algorithm is capable of proposing a word $\hat{v}_3$, then, for each pair $(x,y_0)$, calculation is made of the symbols $\hat{v}(y_0,y_{1i},y_{2j},z(y_0,y_{1i},y_{2j},x))$, where $i,j=1,2$, which are respectively the estimations of the transmitted symbols corresponding to the received symbols $r(y_0,y_{1i},y_{2j},z(y_0,y_{1i},y_{2j},x))$, by solving the system of four linear equations with four unknowns as follows:

$$\hat{v}_s(x, y_0) = \sum_{\substack{i=1,2 \\ j=1,2}} [z(y_0, y_{1i}, y_{2j}, x)]^s \hat{v}(y_0, y_{1i}, y_{2j}, z(y_0, y_{1i}, y_{2j}, x)), \quad (200)$$

where $s=0,1,2,3$.

It will be noted that, due to equation (2), the four symbols $z(y_0,y_{1i},y_{2j},x))$ at fixed $x$ and $y_0$ are distinct taken in pairs, and the result of this is that the determinant of system (200) is a Vandermonde determinant, which guarantees that the system has one solution, and only one.

The word $\hat{v}$, of which the components are the symbols $\hat{v}(y_0,y_{1i},y_{2j},z(y_0,y_{1i},y_{2j},x))$ so obtained, constitutes the codeword associated with the received word $r$. It is possible optionally to add a supplementary step to the method consisting of verifying that the word $\hat{v}$ satisfies the equation $H \cdot v^T = 0$, which makes it possible to detect a possible erroneous correction.

A few observations will now be given concerning the error correction capability of the decoding algorithm according to the invention, by using the example which has just been studied.

The minimum distance guaranteed for the code associated with $H^{(0)}$ is:

$$d_0 = n' - k'_0 + 1 - g' = 78.$$

In correcting the word $r_0$, it is thus possible to correct at most $\text{INT}[(d_0-1)/2]=38$ clusters. Assuming that execution of all the following steps of the decoding method is achieved for the received word considered, it is possible to correct 38 components of $r$ having suffered from a transmission error if each erroneous component of $r_0$ only contains a single erroneous component of $r$, but it is possible to correct up to 152 erroneous components of $r$ (since each cluster contains four components) if it happens that those erroneous components belong to a number of clusters less than or equal to 38. This is to be compared to the conventional error correction algorithms, such as those mentioned advance, which are adapted to correct $\text{INT}[(277-1)/2]=138$ symbols, since the minimum distance guaranteed for the code associated with the matrix H is equal to $n-k+1-g=311+1-35=277$.

The method according to the invention is thus well adapted for applications concerning transmission channels in which burst-type errors tend to occur: this is because this method is simpler to implement than the conventional algorithms, while being essentially as effective on that type of channel. To profit from this advantage in the case where such channels are concerned, the components of the codewords belonging to the same cluster are preferably transmitted one after the other.

Furthermore, it will be shown that the algorithm taking into account the erasures described above makes it possible in favorable cases to reliably correct a number of clusters greater than 38.

It should be recalled first of all that, for an algorithm adapted to take into account the erasures, the natural quantity to consider is the number $(2\theta + \tau)$, where $\tau$ designates the number of deletions in the word to correct, and $\theta$ the number of symbols in that word which have been modified by the algorithm (and in relation to which it did not know in advance that they had to be corrected, that is to say which were not in "erased" positions; this number $\theta$ does not necessarily coincide with the real number of erroneous symbols, that is to say different from those transmitted, since it may occasionally occur that the algorithm proposes a "corrected" word which, although belonging to the code, is nevertheless not the transmitted word). For the algorithms with the best performance, their capability to be able to reliably propose a correction of a received word in all cases (that is to say, whatever the received word), is represented by the formula:

$$2\theta + \tau \leq d-1,$$

where $d$ is the minimum distance of the code.

In the algorithm described above, account is taken of the pairs $(x,y_0)$ identifying the components of $r_0$ which have been corrected, to erase the corresponding components of $r_1$.

To correct $r_1$, the algorithm associated with $H^{(1)}$ must thus take into account, at most, $\tau_1=38$ erasures. However, this algorithm will generally also have to correct $\theta_1$ symbols $r_1(x,y_0)$ corresponding to pairs $(x,y_0)$ for which, by chance, $r_0(x,y_0)$ has a correct value (which means that such a cluster has not been detected by the algorithm associated with $H^{(0)}$ as comprising errors), even though at least two of the symbols $r(y_0,y_{1i},y_{2j},z(y_0,y_{1i},y_{2j},x))$ are erroneous (such a case is very infrequent, and more particularly of the order of $1/q$ where the channel produces errors at random). As furthermore the minimum distance guaranteed for the code associated with $H^{(1)}$ is:

$$d_1 = n' - k'_1 + 1 - g' = 75,$$

it can be seen that, in most cases, the condition $2\theta_1 + \tau_1 \leq d_1 - 1$ will be satisfied, and it will thus be possible to correct $r_1$ reliably.

Similar reasoning naturally then applies to the decoding of $r_2$ and $r_3$. Finally, it will thus be possible to correct the symbols of the received word which belong to clusters not detected by the algorithm associated with $H^{(0)}$, in addition to the symbols of the received word belonging to the (maximum of 38) clusters detected at this step.

In the most general case concerned by the present invention (see above the equations (1.i), (2) and (3)), $\phi$ may be equal to 1, but also greater than 1. The method of constructing clustered codes illustrated in the above example can easily be generalized as follows:

First of all, the $2^{\mu\phi}$ subsets $M_t$ of monomials $Z^t X^u$ are constructed as above, and then each monomial $Z^t X^u$ is replaced by the monomial $Y_0^f Z^s X^u$, where the integers $f$ and $s$ satisfy $t = f \cdot 2^{(\mu-1)\phi} + s$, and are obtained as quotient and remainder: this is because the monomials $Z^t X^u$ and $Y_0^f Z^s X^u$ have the same weight on account of the equations (1.0) and (3). For the maximum value of $t$, i.e. $(2^{\mu\phi}-1)$, the quotient $f$ has the value $(2^\Phi-1)$, and the remainder s has the value $(2^{(\mu-1)\Phi}-1)$. The number of clustered words $v_s$ necessary to "absorb" all the successive powers $Z^s$ is thus equal to $2^{(\mu-1)\Phi}$. On decoding, construction is made on the basis of the received word r and the clustered received words $r_s$ are corrected, of which each is considered as coming from a codeword defined on an algebraic curve represented by the equation (1.0) (it will be noted that in the subsets of monomials which have just been constructed, the last one contains the monomials $Y_0^{e-1}X^u$ after the elimination of the power of Z).

By way of supplementary example, consider the curve represented by the equation $$Z^{16}+Z+X^{17}=0 \quad (299)$$

over $F_{256}$. It is of genus g=120, and may be obtained by taking the fiber product of the µ=2 following algebraic equations:

$$Y_0^4+Y_0+X^{17}=0, \text{ and} \quad (300)$$

$$Y_1^4+Y_1+\beta X^{17}=0, \quad (301)$$

where $\beta=\alpha^{17}$, and $\alpha$ is an element of $F_{256}$ satisfying $$\alpha^8+\alpha^4+\alpha^3+\alpha^2+1=0.$$

This fiber product is obtained by eliminating the unknowns $Y_0$ and $Y_1$ between the two equations (300-301) and the following equation:

$$Z=\beta^4 Y_0+Y^1. \quad (302)$$

As, in this case, φ=2, it is possible here to define the clustered codes, of which their are four, on the algebraic curve associated with the equation (300).

The curve defined by the equation (299) has 4096 points on $F_{256}$, it is thus advantageously maximum, as is the curve defined by equation (99). Nevertheless, the method according to the invention applies just as well to fiber products which are not maximum algebraic curves.

It will be noted that, in the example described in detail above, the clusters are all of identical size, that is to say they all comprise the same number of points of the locating set (i.e. four). This is not the case in general, but the invention applies just as well in the case in which the clusters are of variable size.

To terminate the calculation of the estimated symbols, a system of $2^{\Phi(\mu-1)}$ equations is solved, similar to the system (200), for each cluster; when a cluster is of size strictly less than $2^{\Phi(\mu-1)}$, this system is overdetermined, which advantageously makes it possible to detect estimation errors in the clustered symbols $\hat{v}_s(x,y_0)$ of that cluster. It can be seen that, when the decoding method according to the invention is implemented, the correction of the symbols belonging to small clusters may be rendered more reliable than that of the symbols belonging to large clusters; consequently, this decoding method provides the possibility of "unequal protection" against errors, which is desirable in certain applications as is well known to the person skilled in the art.

Figure 2:
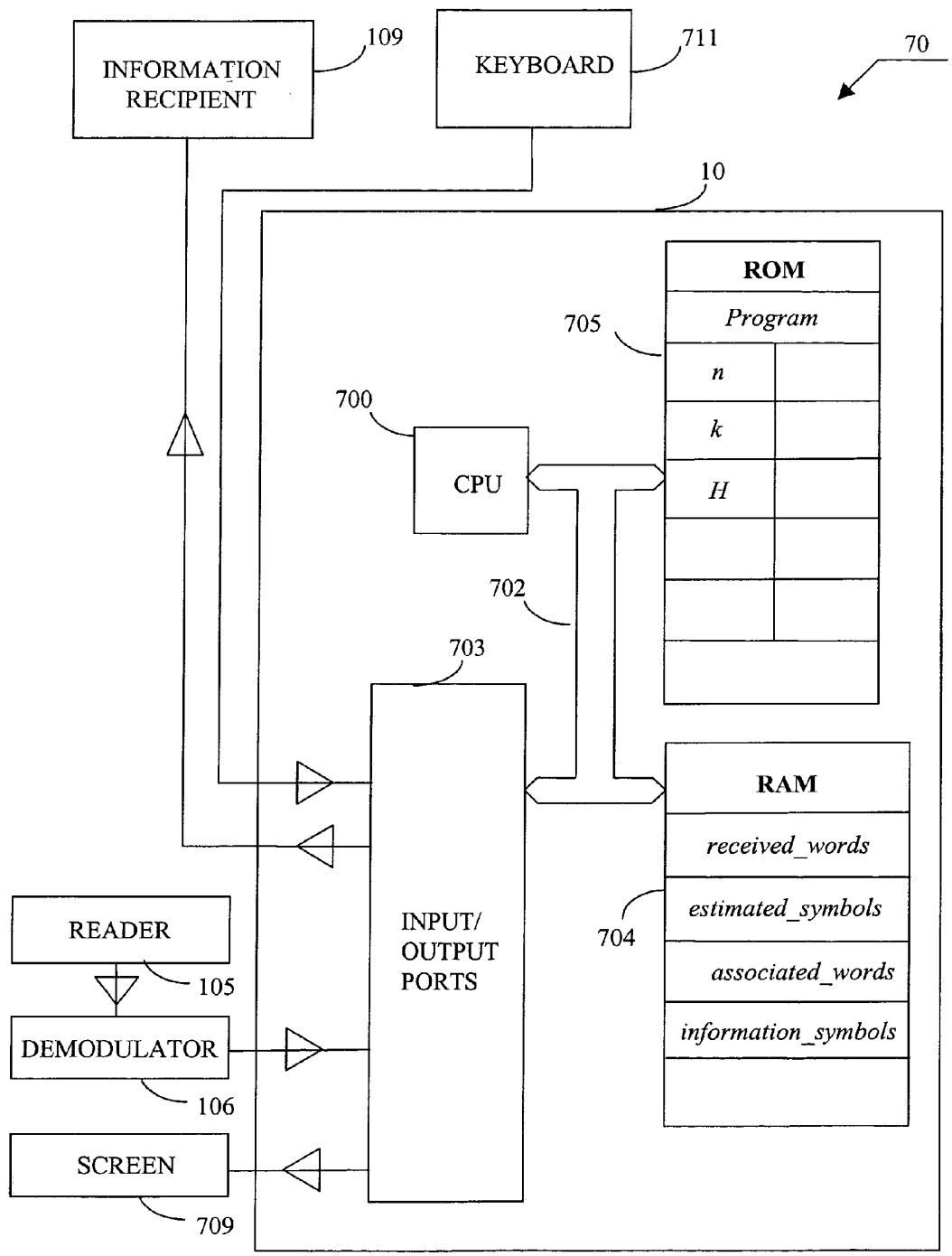
FIG. 2 shows an apparatus for receiving digital signals incorporating a decoder according to the invention.

The block diagram of FIG. 2 represents an apparatus for receiving digital signals 70 incorporating the decoder 10. This apparatus 70 comprises a keyboard 711, a screen 709, a recipient of external information 109, a data reader 105 and a demodulator 106, conjointly connected to input/output ports 703 of the decoder 10 which is produced here in the form of a logic unit.

The decoder 10 comprises, connected together by an address and data bus 702:
a central processing unit 700,
a random access memory (RAM) 704,
read only memory (ROM) 705; and
said input/output ports 703.

Each of the elements illustrated in FIG. 2 is well known to the person skilled in the art of microcomputers and mass storage systems and, more generally, of information processing systems. These known elements are therefore not described here. It should be noted, however, that:
the information recipient 109 could be, for example, an interface peripheral, a display, a modulator, an external memory or other information processing system (not shown), and could be adapted to receive sequences of signals representing speech, service messages or multimedia data in particular of the IP or ATM type, in the form of sequences of binary data,
the reader 105 is adapted to read data recorded on a carrier such as a magnetic or magneto-optic disk.

The random access memory 704 stores data, variables and intermediate processing results, in memory registers bearing, in the description, the same names as the data whose values they store. The random access memory 704 contains in particular the following registers:
registers "received_words", in which the received words are kept,
a register "estimated_symbols", in which are stored the symbols from a received word in course of correction,
a register "associated_words", in which are stored the symbols of the "associated codewords", and
a register "information_symbols", in which are stored the symbols resulting from the redundancy removal.

The read only memory 705 is adapted to store, in registers which, for convenience, have the same names as the data which they store:
the operating program of the central processing unit 700, in a register "program",
the length of each codeword in a register "n",
the number of information symbols in each code word, in a register "k", and
the parity check matrix of the code, in a register "H", An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

What is claimed is:

1. A method of decoding a received word coded according to a one-point algebraic geometric code defined on an algebraic curve represented by an equation in X and Z of degree $2^{\mu\Phi}$ in Z, where φ is a positive integer and µ an integer greater than 1, said equation being a fiber product of µ component algebraic equations, each of said component equations governing an unknown X and an unknown $Y_i$, where i=0, . . . , µ−1, and being of degree $2^\Phi$ in $Y_i$, comprising the steps of:
determining $2^{(\mu-1)\Phi}$ clustered words from the received word;
decoding each of said $2^{(\mu-1)\Phi}$ clustered words, using an algebraic geometric code based on an algebraic curve represented by one of said component equations.

2. A decoding method according to claim 1, a word $\underline{r}$ having been received, comprising the steps of:

for s=0, . . . , $2^{(\mu-1)\Phi}-1$:

calculating the clustered received word $\underline{r}_s$ of which each component $r_s(x,y_0)$ is a linear combination of the components of r indexed by the pair $(x,y_0)$, and is erased if at least one of those components is considered as doubtful by the receiver, and calculating the error syndromes vector $\sigma_s = H^{(s)} r_s^T$, wherein the matrix $H^{(s)}$ is the parity check matrix of a clustered code, attempting to calculate a word $\hat{v}_0$ by correcting the word $r_0$ according to the error syndromes vector $\sigma_0$ by means of an error correction algorithm adapted to take into account the erasures, for $s=1, \ldots, 2^{(\mu-1)\phi}-1$:

where the preceding error correction attempt has succeeded, erasing, for each pair $(x,y_0)$ such that $\hat{v}_0(x,y_0) \neq r_0(x,y_0)$, the symbols $r_l(x,y_0)$, the symbols for $l=s, \ldots, 2^{(\mu-1)\phi}-1$, and attempting to calculate a word $\hat{v}_s$ by correcting the word $r_s$ according to the error syndromes vector $\sigma_s$ by means of an error correction algorithm adapted to take into account the erasures, and wherein the above $2^{(\mu-1)\phi}$ correction attempts have succeeded, calculating, for each cluster of components of r indexed by a pair $(x,y_0)$, the estimated values of the components of the corresponding transmitted word indexed by that pair $(x,y_0)$, by solving a system of $2^{(\mu-1)\phi}$ linear equations using the symbols $\hat{v}_s(x,y_0)$, where $s=0, \ldots, 2^{(\mu-1)\phi}-1$.

3. A device including a non-removable computer-readable medium, comprising computer program code instructions for the execution of the steps of a method according to claim 1.

4. A device including a partially or totally removable computer-readable medium, comprising computer program code instructions for the execution of the steps of a method according to claim 1.

5. A computer-readable medium storing a computer program having instructions such that, when said program controls a programmable data processing device, said instructions lead to said data processing device implementing a method according to claim 1.

6. A method of correcting an error in a received word coded according to an algebraic geometric code comprising the steps of:

producing a plurality of clustered words from a received word, a length of each of the clustered words being shorter than that of the received word;

attempting to correct each of the clustered words in an algebraic geometric code of non-zero genus; and estimating each component of a transmitted word corresponding to the received word from a result of the attempted correction when the attempted correction has succeeded.

7. A method according to claim 6, wherein each component of the clustered words is a linear combination of components of the received word, and each component of the transmitted word corresponding to the received word is estimated by solving a system of equations corresponding to the respective clustered words in said estimating step.

8. A method according to claim 6, wherein said step of attempting to correct each of the clustered words includes:

calculating an error syndrome vector for each of the clustered words by using a parity check matrix of the respective one of the clustered words; and attempting to correct each of the clustered words by using the error syndrome vector for the respective one of the clustered words.

9. A method according to claim 6, wherein said step of attempting to correct each of the clustered words is performed sequentially and said method further comprises the step of erasing after each one of the clustered words is corrected, for each component of the one of the clustered words which is not equal to the corresponding component of the corrected word, corresponding components of other clustered words.

10. A method according to claim 6, wherein the received word is encoded as an algebraic geometric code.

11. A method according to claim 10, wherein, in said attempting step, each of the clustered words is decoded as a hyperelliptic code.

12. A computer-readable medium storing a computer program for controlling a computer, said program comprising codes for causing the computer to perform the method according to claim 6.

13. An error correction device for the decoding a received word coded according to a one-point algebraic geometric code defined on an algebraic curve represented by an equation in X and Z of degree $2^{\mu\phi}$ in Z, where $\phi$ is a positive integer and $\mu$ an integer greater than 1, said equation being a fiber product of $\mu$ component algebraic equations, each of said component equations governing an unknown X and an unknown $Y_i$, where $i=0, \ldots, \mu-1$, and being of degree $2\phi$ in Y, comprising:

means for determining $2^{(\mu-1)\phi}$ clustered words from the received word;

means for decoding each of said $2^{(\mu-1)\phi}$ clustered words, using an algebraic geometric code based on an algebraic curve represented by one of said component equations.

14. An error correction device according to claim 13, a word r having been received, comprising means for:

calculating, for $s=0, \ldots, 2^{(\mu-1)\phi}-1$, the clustered received word $r_s$ of which each component $r_s(x,y_0)$ is a linear combination of the components of r indexed by the pair $(x,y_0)$ and is erased if at least one of those components is considered as doubtful by the receiver, and calculating the error syndromes vector $\sigma_s = H^{(s)} r_s^T$, wherein the matrix $H^{(s)}$ is the parity check matrix of a clustered code, attempting to calculate a word $\hat{v}_0$, by correcting the word $r_0$ according to the error syndromes vector $\sigma_0$ using an error correction algorithm adapted to take into account the erasures, where, for $s=1, \ldots, 2^{(\mu-1)\phi}-1$, the preceding error correction attempt has succeeded, erasing, for each pair $(x,y_0)$ such that $\hat{v}_0(x,y_0) \neq r_0(x,y_0)$, the symbols $r_l(x,y_0)$ for $l=s2^{(\mu-1)\phi}-1$, and attempting to calculate a word $\hat{v}_s$ by correcting the word $r_s$ according to the error syndromes vector $\sigma_s$ using an error correction algorithm adapted to take into account the erasures, and where the above $2^{(\mu-1)\phi}$ correction attempts have succeeded, calculating, for each cluster of components of r indexed by a pair $(x,y_0)$, the estimated values of the components of the corresponding transmitted word indexed by that pair $(x,y_0)$ by solving the system of $2^{(\mu-1)\phi}$ linear equations using the symbols $\hat{v}_s(x,y_0)$, where $s=0, \ldots, 2^{(\mu-1)\phi}-1$.

15. A decoder comprising:

at least one device for correcting errors according to claim 13, and at least one redundancy removal device.

16. Apparatus for receiving encoded digital signals comprising a decoder according to claim 15, and means for demodulating said encoded digital signals.

17. A computer system, comprising a decoder according to claim 15, and:

at least one hard disk, and at least one means for reading that hard disk.

18. A device for correcting an error in a received word coded according to an algebraic geometric code, comprising:

production means for producing a plurality of clustered words from a received word, a length of each of the clustered words being shorter than that of the received word;

attempting means for attempting to correct each of the clustered words in an algebraic geometric code of non-zero genus; and estimation means for estimating each component of a transmitted word corresponding to the received word from a result of the attempted correction when the attempted correction has been succeeded.

* * * * *

UNITED STATES PATENT AND TRADEMARK OFFICE
CERTIFICATE OF CORRECTION

PATENT NO. : 7,392,461 B2
APPLICATION NO. : 11/034009
DATED : June 24, 2008
INVENTOR(S) : Philippe Piret et al.

It is certified that error appears in the above-identified patent and that said Letters Patent is hereby corrected as shown below:

ON THE TITLE PAGE [56] References Cited:

FOREIGN PATENT DOCUMENTS, "WO2004047306" should read --WO2004/047306--; and
OTHER PUBLICATIONS, After R.E. Blahut,: "XP002272857" should read --XP002272857,--.

ON THE TITLE PAGE [57] ABSTRACT:

Line 11, "equations." should read --equations--.
The invention also relates to devices and apparatuses adapted to implement this method.--.

COLUMN 3:

Line 13, "x andy" should read --x and y--;
Line 55, "IEEE" should read --(IEEE--; and
Line 60, "Bound"" should read --Bound",--.

COLUMN 6:

Line 15, "$r_0$" should read --$\underline{r}_0$--.

COLUMN 10:

Line 23, "for $H^{(1)}$" should read for --$H^{(1)}$,--;
Line 25, "for $H^{(2)}$" should read for --$H^{(2)}$,--;
Line 28, "for $H^{(3)}$" should read for --$H^{(3)}$,--; and Line 67, " $M'_7 \{Z^3 Y_0 X^u | 0 \leq u \leq 33\}$ " should read -- $M'_7 = \{Z^3 Y_0 X^u | 0 \leq u \leq 33\}$ .--.

COLUMN 11:

Line 56, "virtue" should read --virtue of--.

COLUMN 12:

Line 40, "$\hat{v}_1$" should read --$\underline{\hat{v}}_1$--.

UNITED STATES PATENT AND TRADEMARK OFFICE
CERTIFICATE OF CORRECTION

PATENT NO.         : 7,392,461 B2                                        Page 2 of 2
APPLICATION NO.    : 11/034009
DATED              : June 24, 2008
INVENTOR(S)        : Philippe Piret et al.

It is certified that error appears in the above-identified patent and that said Letters Patent is hereby corrected as shown below:

COLUMN 13:

Line 62, "advance," should read --in advance,--.

COLUMN 15:

Line 27, "$Z = \beta^4 Y_0 + Y^1$." should read --$Z = \beta^4 Y_0 + Y_1$.--.

COLUMN 16:

Line 57, "word;" should read --word; and--.

COLUMN 17:

Line 7, "$\hat{v}_0$" should read --$\underline{\hat{v}}_0$--.

COLUMN 18:

Line 5, "components" should read --to the components--;
Line 15, "decoding" should read --decoding of--;
Line 24, "word;" should read --word; and--; and
Line 59, "signals" should read --signals,--.

Signed and Sealed this

Third Day of February, 2009

JOHN DOLL
*Acting Director of the United States Patent and Trademark Office*